United States Patent
Yoshihara

(10) Patent No.: US 6,455,204 B1
(45) Date of Patent: Sep. 24, 2002

(54) X-RAY MASK AND METHOD OF FABRICATING THE SAME

(75) Inventor: Takuya Yoshihara, Tokyo (JP)

(73) Assignee: NEC Corporation, Tokyo (JP)

( * ) Notice: Subject to any disclaimer, the term of this patent is extended or adjusted under 35 U.S.C. 154(b) by 45 days.

(21) Appl. No.: 09/664,746

(22) Filed: Sep. 19, 2000

Related U.S. Application Data

(63) Continuation of application No. 09/313,986, filed on May 19, 1999, now Pat. No. 6,197,457.

(30) Foreign Application Priority Data

Sep. 5, 1922 (JP) .............................................. 10-140771

(51) Int. Cl.[7] .............................. G03F 9/00; G02B 5/08
(52) U.S. Cl. ............................................. 430/5; 378/35
(58) Field of Search ....................... 430/5, 322; 378/34, 378/35; 427/123; 428/688, 689, 697

(56) References Cited

U.S. PATENT DOCUMENTS

| 6,066,418 A | 5/2000 | Yoshihara ........................ 430/5 |
| 6,285,737 B1 * | 9/2001 | Sweatt et al. .................. 378/35 |

FOREIGN PATENT DOCUMENTS

| JP | 2-2109 | 1/1990 |
| JP | 2-94421 | 4/1990 |
| JP | 3-34414 | 2/1991 |
| JP | 9-190958 | 7/1997 |
| JP | 10-79347 | 3/1998 |

OTHER PUBLICATIONS

M. Sugawara et al., "Stress–free and amorphous $Ta_4B$ or $Ta_8SB$ absorbers for x–ray masks", Journal of Vacuum Science and Technology, vol. B7, No. 6, (1989), p. 1561–1564.

H. Yabe et al., "Sputtered W–Ti Film for X–ray Mask Absorber", Japanese Journal Applied Physics, vol. 31, N. 12B, Dec. 1992, pp. 4210–4214.

* cited by examiner

*Primary Examiner*—S. Rosasco
(74) *Attorney, Agent, or Firm*—Sughrue Mion, PLLC

(57) ABSTRACT

An X-ray mask including (a) an X-ray permeable membrane and (b) an X-ray absorber formed in a pattern on the X-ray permeable membrane. The X-ray absorber is composed of an alloy having one of the following groups: (a) tantalum (Ta), ruthenium (Ru), and germanium (Ge); (b) tantalum (Ta), ruthenium (Ru), and silicon (Si); (c) rhenium (Re) and germanium (Ge); and (d) tungsten (W) and germanium (Ge). The X-ray mask provides advantageous features, such as having high ability for absorbing X-ray therein, possible reproduction of a thin film having low stress and having a densified crystal structure.

29 Claims, 7 Drawing Sheets

X-RAY MASK AND METHOD OF FABRICATING THE SAME

This is a Continuation Application of application Ser. No. 09/313,986 filed May 19, 1999 now U.S. Pat. No. 6,197,457, the disclosure of which is incorporated herein by reference.

BACKGROUND OF THE INVENTION

1. Field of the Invention

The invention relates to an X-ray mask employed in fabrication of a semiconductor device, and more particularly to such an X-ray mask including an X-ray absorber composed of an alloy having low stress. The invention relates further to a method of fabricating such an X-ray mask, and still further to a method of fabricating a semiconductor device through the use of such an X-ray mask.

2. Description of the Related Art

As a semiconductor device has been integrated highly, X-ray lithography has been employed for formation of a minute pattern. The X-ray lithography is characterized by features that X-ray has a short wavelength, and that it is relatively easy to have a great depth of focus. The X-ray lithography is suitable particularly for making a small pattern having a length of 10 nm or smaller, or a pattern having a great aspect ratio. The X-ray lithography is employed also in fabrication of a liquid crystal display panel, a charge coupled device (CCD), a thin film magnetic head, and a micro-machine as well as LSI such as memory and logic.

In the X-ray lithography, a resist film is deposited on a wafer, and then, X-ray is radiated onto the resist film through an X-ray mask to thereby make a pattern. Specifically, an X-ray mask composed of X-ray absorber and having a pattern corresponding to a pattern of a semiconductor device to be fabricated is used. The X-ray mask is positioned in the close vicinity of a surface of a wafer on which an X-ray resist film has already been deposited. Then, X-ray is radiated onto the resist film through the X-ray mask to thereby transfer a pattern of the X-ray mask to the resist film.

The above-mentioned X-ray mask is usually comprised of a membrane through which X-ray can pass, X-ray absorbing material arranged on the membrane, a silicon substrate, and a support such as a glass plate for cooperating with the silicon substrate to support the membrane at its periphery.

FIG. 1 illustrates an example of an X-ray mask. The illustrated X-ray mask is comprised of a membrane 2 composed of silicon nitride (SiN), silicon carbide (SiC) or diamond (C) in the form of a thin film, an X-ray absorber 1 formed on the membrane 2 and having a desired pattern, a silicon substrate 3 supporting the membrane 2 at its periphery, and a support ring 4 composed of silicon carbide or quartz glass and cooperating with the silicon substrate 3 to thereby support the membrane 2.

In conventional X-ray masks, the X-ray absorber 1 has usually been, composed of simple metal such as tungsten (W) and tantalum (Ta).

A method of fabricating the X-ray mask illustrated in FIG. 1 is explained hereinbelow with reference to FIGS. 2A to 2D.

First, thin films 2a are deposited on opposite surfaces of a silicon substrate 3 by chemical vapor deposition. The silicon substrate 3 has a thickness of 1 to 2 mm. The thin films 2a are composed of silicon carbide (SiC) and have a thickness of about 1 to 2 μm. One of the thin films 2a will make a membrane 2.

Then, as illustrated in FIG. 2A, a support ring 4 is adhered to a lower surface of the silicon substrate 3 at its periphery by means of an adhesive such as epoxy resin. The support ring 4 is composed of glass or silicon carbide (SiC), and has a thickness of about 5 mm.

Then, as illustrated in FIG. 2B, the silicon substrate 3 is back etched from a lower surface thereof by anisotropic etching through the use of KOH aqueous solution. As a result of the etching, a portion of the silicon substrate 3 is removed, and there is formed a membrane 2 on the silicon substrate 3.

Then, as illustrated in FIG. 2C, an X-ray absorbing material 1 is deposited on the membrane 2 by sputtering.

Then, as illustrated in FIG. 2D, the X-ray absorbing material 1 is patterned into a desired pattern 1a by dry etching. Thus, there is completed an X-ray mask having a desired pattern 1a.

In the method illustrated in FIGS. 2A to 2D, although the silicon substrate 3 is back-etched prior to depositing and patterning the X-ray absorbing material 1, the silicon substrate 3 may be back-etched after deposition of the X-ray absorbing material 1.

In order to make a minute pattern of a semiconductor device by means of X-ray lithography, an X-ray absorbing material of which an X-ray mask is composed is required to have the following characteristics.

First, an X-ray absorbing material has to have high ability of disallowing X-ray to pass therethrough, in order to provide sufficient contrast in X-ray exposure. Herein, such ability of disallowing X-ray to pass therethrough is defined as a product of a mass absorption coefficient and a density of an X-ray absorbing material. An X-ray absorbing material is particularly required to have high ability of disallowing passage therethrough of X-ray having a wavelength of about 1 nm, which X-ray is usually used in X-ray lithography.

If an X-ray absorbing material has smaller ability of disallowing X-ray to pass therethrough, a film composed of an X-ray absorbing material, to be formed on a membrane, has to have a greater thickness. In which case, it would be quite difficult to make a minute pattern of the X-ray absorbing material.

In addition, if a film composed of an X-ray absorbing material has a great thickness, problems such as inaccurate transfer of a pattern to an X-ray absorbing material, and difficulty of controlling stress remaining in a film composed of an X-ray absorbing material,would be caused.

Second, an X-ray absorbing material has to have a stress as small as possible, and further have high controllablity of stress.

If a film composed of an X-ray absorbing material, formed on a membrane has a great internal stress, positional accuracy with which a pattern is transferred to an X-ray absorbing material from an X-ray mask would be deteriorated, and as a result, misalignment would be caused in a semiconductor device pattern. Accordingly, an X-ray absorbing material is required to have almost zero internal stress all over a surface of an X-ray mask.

In addition, taking productivity of an X-ray mask into consideration, an X-ray mask is required to not only have an almost zero internal stress, but also be able to be repeatedly fabricated in the same configuration. Furthermore, since an X-ray mask is repeatedly employed, an X-ray mask is required to have stability in stress.

Third, an X-ray absorbing material is required to have a densified crystal structure.

Most metals that have been used as an X-ray absorbing material is changed into a polycrystalline film having a columnar structure when deposited into a film by sputtering. If such a polycrystalline film is patterned, grain boundary would appear at a sidewall thereof, resulting in a side surface of a pattern having much roughness, in which case, it is no longer possible to form a desired pattern of a semiconductor device.

Apart from the above-mentioned characteristics, an X-ray absorbing material is required to have conformity to dry-etching to be carried out in patterning, and to have chemical stability.

However, conventional X-ray absorbing materials used so far cannot meet all of the above-mentioned requirements.

Tungsten (W) and tantalum (Ta) have been conventionally and widely used as an X-ray absorbing material, because these metals meet the above-mentioned first requirement. That is, those metals have sufficient ability of disallowing passage of X-ray therethrough. However, tungsten (W) and tantalum (Ta) cannot meet the above-mentioned second and third requirements, and hence these metals cannot be used for an X-ray mask when a minute pattern of a semiconductor device is to be formed.

If a film is formed of tungsten (W) or tantalum (Ta) by sputtering, a resultant film would be a polycrystalline film having a columnar structure. Hence, when a minute pattern is to be formed of tungsten (W) or tantalum (Ta) by sputtering, grain boundary would be generated at a sidewall of a pattern to thereby rough the sidewall, which is a big hindrance the accomplishment of a desired minute pattern.

In addition, a stress in a tungsten or tantalum film is very dependent on conditions for forming a film by sputtering, specifically, a pressure at which a film is formed, namely, a pressure of sputtering gas, and a temperature at which a film is formed. For instance, as illustrated in FIG. 4, a stress of a tantalum film varies from a compressive stress to a tensile stress depending on a pressure of sputtering gas.

It is a key that a stress is significantly varied in a range where a stress is equal to about zero. That is, even if a film is formed in such a condition that a resultant film has a zero stress, a stress would be varied much by slight fluctuation in film-forming conditions, resulting in much deterioration in reproducibility of a film.

In addition, since a film stress is dependent on a film temperature in fabrication of a tungsten or tantalum film by sputtering, a problem of non-uniformity in a stress would be caused if there is a difference in temperature in an X-ray mask between a central portion and a peripheral portion at which the X-ray mask is supported with a support ring.

In order to overcome such a problem, it would be necessary to control a temperature of a membrane by filling a lower surface of a membrane with helium (He), independently control a temperature of a support ring and a membrane, or strictly control a temperature of a vacuum chamber of a film deposition apparatus. As mentioned above, a film composed of tungsten or tantalum is accompanied with a problem that it is quite difficult to keep a stress uniform in a film.

Among the above-mentioned problems of a tungsten or tantalum film, various materials have been suggested in order to solve the problems a with respect to crystalline structure.

For instance, as an X-ray absorbing material of which an X-ray mask is composed, M. Sugihara et al. have suggested the use of $Ta_4B$ in Journal of Vacuum Science and Technology, Vol. B7, No. 6, 1989, pp. 1561, and H. Yabe et al. have suggested the use of WTiN in Japanese Journal of Applied Physics, Vol. 31, 1990, pp. 4210. Since $Ta_4B$ and WTiN are both amorphous, the use of these materials can solve the problem that a sidewall of a pattern is roughed due to the above-mentioned polycrystalline structure.

However, boron (B), titanium (Ti), and nitrogen (N), which have mixed with tantalum or tungsten, are atoms having small ability to disallow X-ray to pass therethrough. Hence, if an X-ray mask is composed of an alloy composed of tantalum or tungsten together with boron (B), titanium (Ti), or nitrogen (N), a new problem that the X-ray mask cannot avoid having a greater thickness than a thickness of an X-ray mask, composed singly of tungsten (W) or tantalum (Ta) in order to provide sufficient contrast in X-ray exposure would be caused. For instance, Japanese Unexamined Patent Publication No. 2-2109 has suggested the use of Ta and one of Al, Ti, Si and Mo for composing an X-ray mask thereof.

However, an alloy composed of Ta and one of Al, Ti and Si is accompanied with a problem of small ability of disallowing X-ray to pass therethrough. As to an alloy composed of Ta and Mo, it has no improvement in crystalline structure, since a film composed of such an alloy has a columnar polycrystalline structure.

As mentioned so far, an X-ray absorbing material of which an X-ray mask is composed, having been suggested so far, cannot meet the above-mentioned characteristics required for an X-ray absorbing material.

Apart from the above-mentioned X-ray absorbing materials, various materials have been suggested.

Japanese Unexamined Patent Publication No. 2-94421 has suggested an X-ray mask composed of tungsten (W) and rhenium (Re).

Japanese Unexamined Patent Publication No. 3-34414 has suggested an X-ray mask composed of tantalum (Ta) and nickel (Ni), a ratio of the number of atoms between tantalum and nickel being 3.0:7.0 to 5.0:5.0.

Japanese Unexamined Patent Publication No. 9-190958 has suggested an X-ray mask composed of tantalum (Ta) and germanium (Ge).

However, the materials as suggested in the above-mentioned Publications cannot meet the above-mentioned characteristics required for an X-ray absorbing material.

SUMMARY OF THE INVENTION

In view of the above-mentioned problems of the conventional X-ray masks, it is an object of the present invention to provide an X-ray mask which meets all the characteristics required for an X-ray absorbing material, i.e., that it has high ability to absorb X-ray therein, it makes it possible to reproduce a thin film having a low stress, and it has a densified crystal structure. It is also an object of the present invention to provide a method of fabricating such an X-ray mask. It is further an object of the present invention to provide a method of fabricating a semiconductor device through the use of such an X-ray mask.

In one aspect of the present invention, there is provided an X-ray mask including (a) an X-ray permeable membrane, and (b) an X-ray absorber formed in a pattern on the X-ray permeable membrane, the X-ray absorber being composed of an alloy comprising tantalum (Ta), ruthenium (Ru), and germanium (Ge).

It is preferable that the alloy contains ruthenium (Ru) in an amount of 3 to 60 atomic %, and germanium (Ge) in an amount of 1 to 30 atomic %.

It is preferable that the alloy contains tantalum (Ta), ruthenium (Ru), and germanium (Ge) in a total amount of 95 atomic % or greater.

It is preferable that the alloy is amorphous.

There is further provided an X-ray mask including (a) an X-ray permeable membrane, and (b) an X-ray absorber formed in a pattern on the X-ray permeable membrane, the X-ray absorber being composed of an alloy comprising tantalum (Ta), ruthenium (Ru), and silicon (Si).

It is preferable that the alloy contains ruthenium (Ru) in an amount of 3 to 60 atomic %, and silicon (Si) in an amount of 1 to 30 atomic %.

It is preferable that the alloy contains tantalum (Ta), ruthenium (Ru), and silicon (Si) in a total amount 95 atomic % or greater.

There is still further provided an X-ray mask including (a) an X-ray permeable membrane, and (b) an X-ray absorber formed in a pattern on the X-ray permeable membrane, the X-ray absorber being composed of an alloy comprising rhenium (Re) and germanium (Ge).

It is preferable that the alloy contains germanium (Ge) in an amount of 1 to 30 atomic %.

It is preferable that the alloy contains rhenium (Re) and germanium (Ge) in a total amount of 95 atomic % or greater.

There is yet further provided an X-ray mask including (a) an X-ray permeable membrane, and (b) an X-ray absorber formed in a pattern on the X-ray permeable membrane, the X-ray absorber being composed of an alloy comprising tungsten (W) and germanium (Ge).

It is preferable that the alloy contains germanium (Ge) in an amount of 1 to 30 atomic %.

It is preferable that the alloy contains tungsten (W) and germanium (Ge) in a total amount of 95 atomic % or greater.

In another aspect of the present invention, there is provided a thin film composed of an alloy, the alloy being composed of one of the following groups (a) tantalum (Ta), ruthenium (Ru), and germanium (Ge), (b) tantalum (Ta), ruthenium (Ru), and silicon (Si), (c) rhenium (Re) and germanium (Ge), and (d) tungsten (W) and germanium (Ge).

In still another aspect of the present invention, there is provided a method of fabricating an X-ray mask, including the steps of (a) forming a thin film on an X-ray permeable membrane, the thin film composed of an alloy comprising one of the following groups (a1) tantalum (Ta), ruthenium (Ru), and germanium (Ge), (a2) tantalum (Ta), ruthenium (Ru), and silicon (Si), (a3) rhenium (Re) and germanium (Ge), and (a4) tungsten (W) and germanium (Ge), and (b) patterning the thin film in a desired pattern.

It is preferable that the method further includes the step of annealing the thin film, in which case, it is also preferable that the thin film is formed in the step (a) so as to have a compressive stress therein.

It is preferable that the annealing is carried out at a temperature equal to or greater than 100 degrees centigrade. It is preferable that the annealing is carried out in vacuum atmosphere or in inert gas atmosphere. It is preferable that the step of annealing the thin film is carried out subsequent to the step (a), but prior to the step (b).

It is preferable that the thin film is formed by sputtering in the step (a).

It is preferable that the thin film is formed in the step (a) so as to have a stress more tensile than a target stress.

It is preferable that the method further includes the step of calculating deformation in the thin film's pattern after the thin film has been formed, based on a stress of the thin film, and compensating for the pattern on the basis of the calculation.

In yet another aspect of the present invention, there is provided a method of forming a film required to have a low stress therein, including the steps of (a) forming a thin film composed of an alloy including one of the following groups (a1) tantalum (Ta), ruthenium (Ru), and germanium (Ge), (a2) tantalum (Ta), ruthenium (Ru), and silicon (Si), (a3) rhenium (Re) and germanium (Ge), and (a4) tungsten (W) and germanium (Ge), and (b) patterning the thin film in a desired pattern.

In still yet another aspect of the present invention, there is provided a method of fabricating a semiconductor device, including the steps of (a) depositing a resist film on a substrate, (b) setting an X-ray mask above the resist film, and (c) radiating X-ray to the resist film through the X-ray mask to thereby pattern the resist film in a desired pattern, the X-ray mask including (a) an X-ray permeable membrane, and (b) an X-ray absorber formed in a pattern on the X-ray permeable membrane, the X-ray absorber being composed of an alloy including one of the following groups (a) tantalum (Ta), ruthenium (Ru), and germanium (Ge), (b) tantalum (Ta), ruthenium (Ru), and silicon (Si), (c) rhenium (Re) and germanium (Ge), and (d) tungsten (W) and germanium (Ge).

It is preferable that the alloy comprised of tantalum (Ta), ruthenium (Ru), and germanium (Ge) contains ruthenium (Ru) in an amount of 3 to 60 atomic %, and germanium (Ge) in an amount of 1 to 30 atomic %.

It is preferable that the alloy comprised of tantalum (Ta), ruthenium (Ru), and germanium (Ge) contains tantalum (Ta), ruthenium (Ru), and germanium (Ge) in a total amount of 95 atomic % or greater.

It is preferable that the alloy comprised of tantalum (Ta), ruthenium (Ru), and silicon (Si), contains ruthenium (Ru) in an amount of 3 to 60 atomic %, and silicon (Si) in an amount of 1 to 30 atomic %.

It is preferable that the alloy comprised of tantalum (Ta), ruthenium (Ru), and silicon (Si) contains tantalum (Ta), ruthenium (Ru), and silicon (Si) in a total amount of 95 atomic % or greater.

It is preferable that the alloy comprised of rhenium (Re) and germanium (Ge) contains germanium (Ge) in an amount of 1 to 30 atomic %.

It is preferable that the alloy comprised of rhenium (Re) and germanium (Ge) contains rhenium (Re) and germanium (Ge) in a total amount of 95 atomic % or greater.

It is preferable that the alloy comprised of rhenium (Re) and tungsten (W) contains germanium (Ge) in an amount of 1 to 30 atomic %.

It is preferable that the alloy comprised of rhenium (Re) and tungsten (W) contains tungsten (W) and germanium (Ge) in a total amount of 95 atomic % or greater.

The advantages obtained by the aforementioned present invention will be described hereinbelow.

In accordance with the present invention, there is obtained a thin film composed of an alloy comprised of TaRuGe, TaRuSi, ReGe or WGe in a wide range of alloy composition.

In addition, it is possible to form a thin film having a low stress with high reproducibility by controlling a pressure of sputtering gas and a composition ratio of the film.

A thin film composed of TaRuGe, ReGe or WGe alloy can have higher ability to disallow X-ray to pass therethrough than a thin film composed of conventional X-ray absorbing materials. A thin film composed of TaRuSi alloy can have almost the same ability to disallow X-ray to pass therethrough as that of conventional X-ray absorbing materials.

Thus, the present invention provides an X-ray mask which is composed of an X-ray absorbing material having the above-mentioned characteristics, and which is suitable for fabrication of a semiconductor device having a minute pattern.

A stress in the thin film composed of TaRuGe, TaRuSi, ReGe or WGe is hardly influenced by a parameter other than a pressure of sputtering gas. Hence, a cheap or simple film-deposition apparatus could deposit a thin film composed of TaRuGe, TaRuSi, ReGe or WGe with high reproducibility. Thus, it would be possible to reduce fabrication cost of an X-ray mask, and hence, fabrication cost of a semiconductor device.

Furthermore, a stress in the thin film composed of TaRuGe, TaRuSi, ReGe or WGe can be controlled by annealing to be carried out during deposition of the thin film. This enhances reproducibility of a stress in the thin film.

In addition, the present invention makes it possible to fabricate a semiconductor device including a pattern having a width of about 0.1 μm or smaller, with high fabrication yield, by carrying out lithography through the use of an X-ray mask composed of an X-ray absorbing material composed of TaRuGe, TaRuSi, ReGe or WGe alloy.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 3:
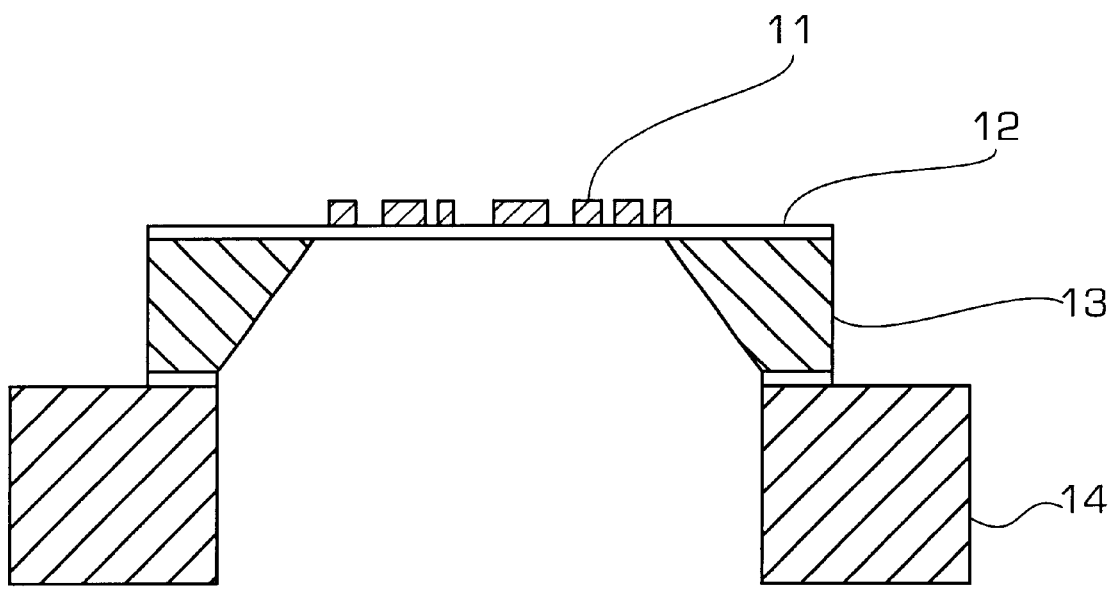
FIG. 3 is a cross-sectional view of an X-ray mask in accordance with the first embodiment of the present invention.

As illustrated in FIG. 3, an X-ray mask in accordance with the first embodiment is comprised of a membrane 12 composed of silicon nitride (SiN), silicon carbide (SiC) or diamond (C) in the form of a thin film, an X-ray absorber 11 formed on the membrane 2 and having a desired pattern, a silicon substrate 13 supporting the membrane 2 at its periphery, and a support ring 14 composed of silicon carbide or quartz glass and cooperating with the silicon substrate 13 to thereby support the membrane 12.

As mentioned below, the X-ray absorber 11 is composed of TaRuGe alloy, TaRuSi alloy, ReGe alloy, or WGe alloy.

The X-ray absorber 11 is deposited on the membrane 12 in the form of a thin film by sputtering.

Figure 1:
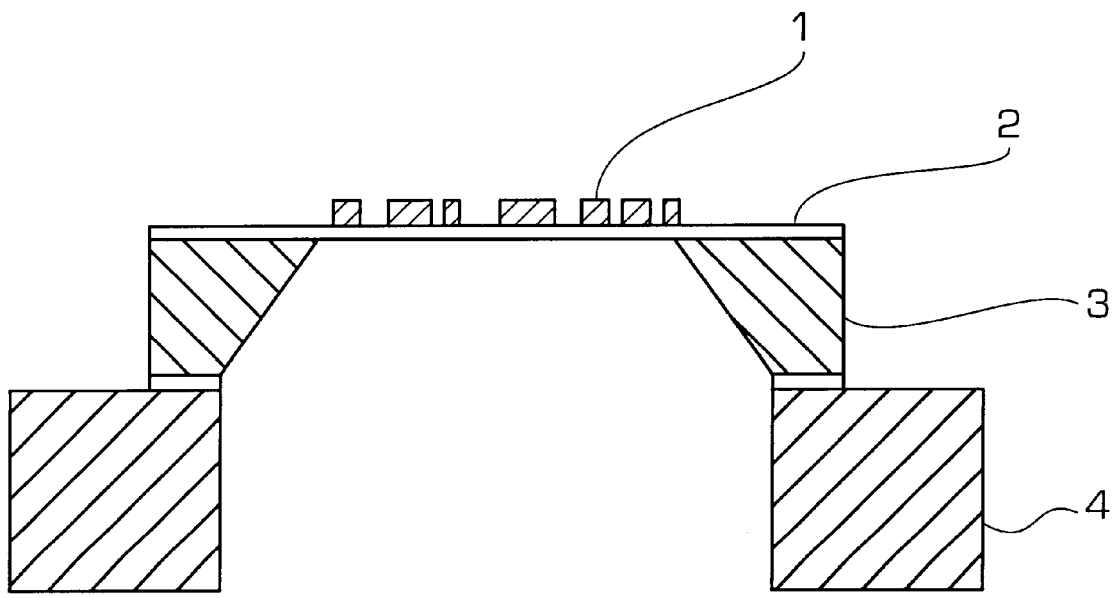
FIG. 1 is a cross-sectional view of a conventional X-ray mask.
Figure 2A:
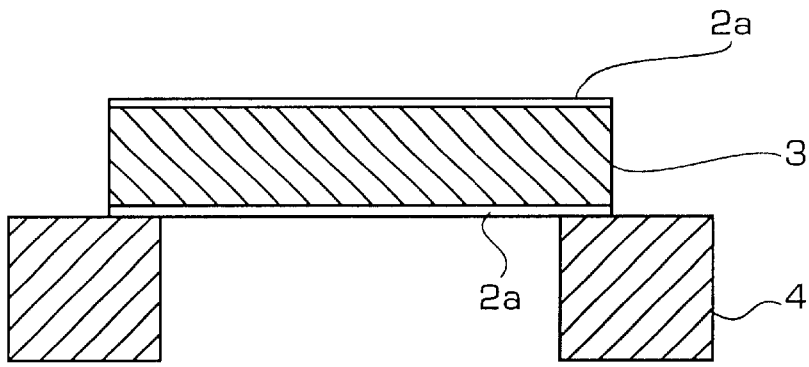
FIGS. 2A to 2D are cross-sectional views of the conventional X-ray mask illustrated in FIG. 1, illustrating respective steps of a method of fabricating the same.
Figure 2B:
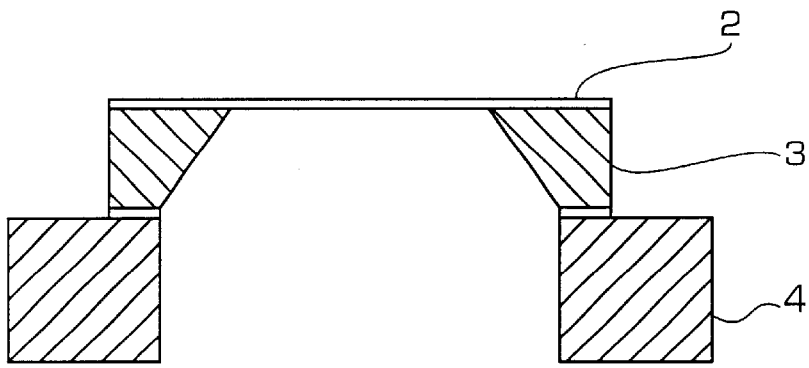
Figure 2C:
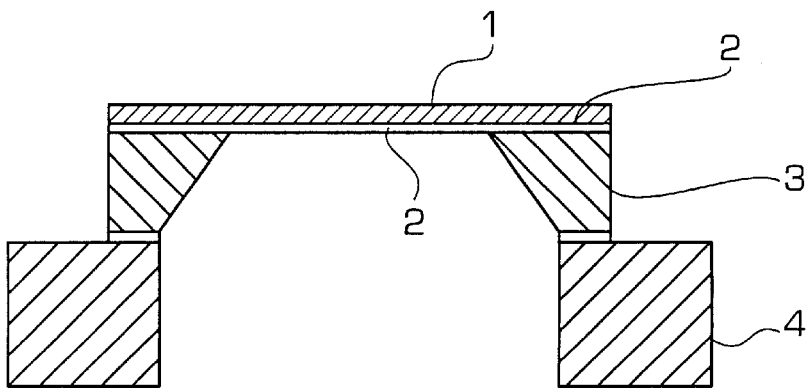
Figure 2D:
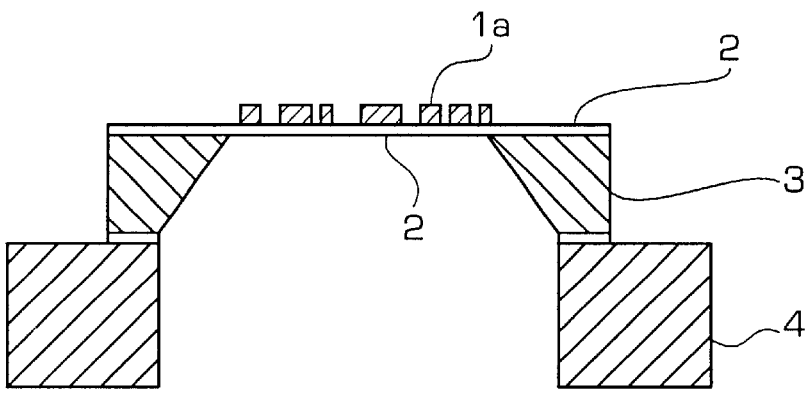

A final configuration of the X-ray mask in accordance with the first embodiment is the same as that of the conventional X-ray mask illustrated in FIG. 1. However, the X-ray mask in accordance with the first embodiment is different from the conventional X-ray mask in that the X-ray absorber 11 is composed of TaRuGe alloy, TaRuSi alloy, ReGe alloy, or WGe alloy.

The X-ray mask in accordance with the first embodiment may be fabricated by the conventional method as illustrated in FIGS. 2A to 2D where the silicon substrate 3 is back etched prior to the deposition of the X-ray absorbing material 11. The silicon substrate 13 may be back etched after the deposition of the X-ray absorber 11 onto the membrane 12.

Hereinbelown is explained a method of forming the X-ray absorber 11 composed of TaRuGe alloy, TaRuSi alloy, ReGe alloy, or WGe alloy in the form of a thin film, and characteristics of the X-ray absorber 11. In the explanation set forth below, it is supposed that the X-ray absorber 11 is composed of TaRuGe alloy.

In the first embodiment, the thin film 11 composed of TaRuGe alloy was deposited by sputtering. As a sputtering apparatus, an ordinary RF sputtering apparatus in which sputtering gas was discharged by applying high frequency power having a frequency of 13.56 MHz thereto was used Xe gas was used as sputtering gas. As a sputter target, an alloy target composed of mixedly sintered Ta, Ru and Ge was used. It is possible to control a composition ratio of a resultant TaRuGe film by varying a mixture ratio among Ta, Ru and Ge in the alloy target.

It should be noted that a sputtering apparatus for depositing the thin film 11 composed of TaRuGe alloy is not to be limited to the above-mentioned RF sputtering apparatus. There may be employed any other sputtering apparatuses such as a direct current sputtering apparatus, if it is able to deposit a metal-film.

A sputtering apparatus for depositing the thin film 11 composed of TaRuGe alloy is not necessary to have any particular means for controlling a stress in the thin film 11. For instance, it is not necessary for a sputtering apparatus to include a device for making a vacuum chamber vacuous in super-high degree, a controller for controlling a temperature of a wall of a vacuum chamber, and a controller for controlling a temperature of the membrane 12.

Though Xe gas was used as sputtering gas in the instant embodiment, other gases may be used such as argon (Ar) gas. Comparing Ar gas to Xe gas as sputtering gas, less amount of Xe gas is absorbed into a resultant thin film than Ar gas, because Xe has a greater atomic radius than that of Ar. Hence, it is possible to provide a thin film having better stress controllability, stability and density by using Xe gas as sputtering gas than those of a thin film deposited by using Ar gas.

As to a sputtering target used for depositing the thin film 11 composed of TaRuGe, as well as the above-mentioned target composed of mixedly sintered Ta, Ru and Ge, a mosaic target including mixedly sintered any two metals among Ta, Ru and Ge, and a remaining one, or a mosaic target including sintered any one of Ta, Ru and Ge, and remaining two metals may be used.

The thin film 11 composed of TaRuGe alloy, deposited by sputtering, has an amorphous structure in a wide range of a composition ratio. The thin film 11 would have an amorphous structure when the thin film 11 contains Ge in an amount of 1 to 30 atomic % and Ru in an amount of 3 to 60 atomic %. In the specification, composition of an alloy is indicated by a ratio of atoms of each elements, or atomic percent. Hence, the thin film 11 composed of TaRuGe alloy and having such a composition ratio as mentioned above is not roughed by grain boundary, even if the thin film 11 is patterned into a size of 100 nm or smaller for fabricating an X-ray mask. Namely, the resultant X-ray mask could have a smooth sidewall.

Figure 4:
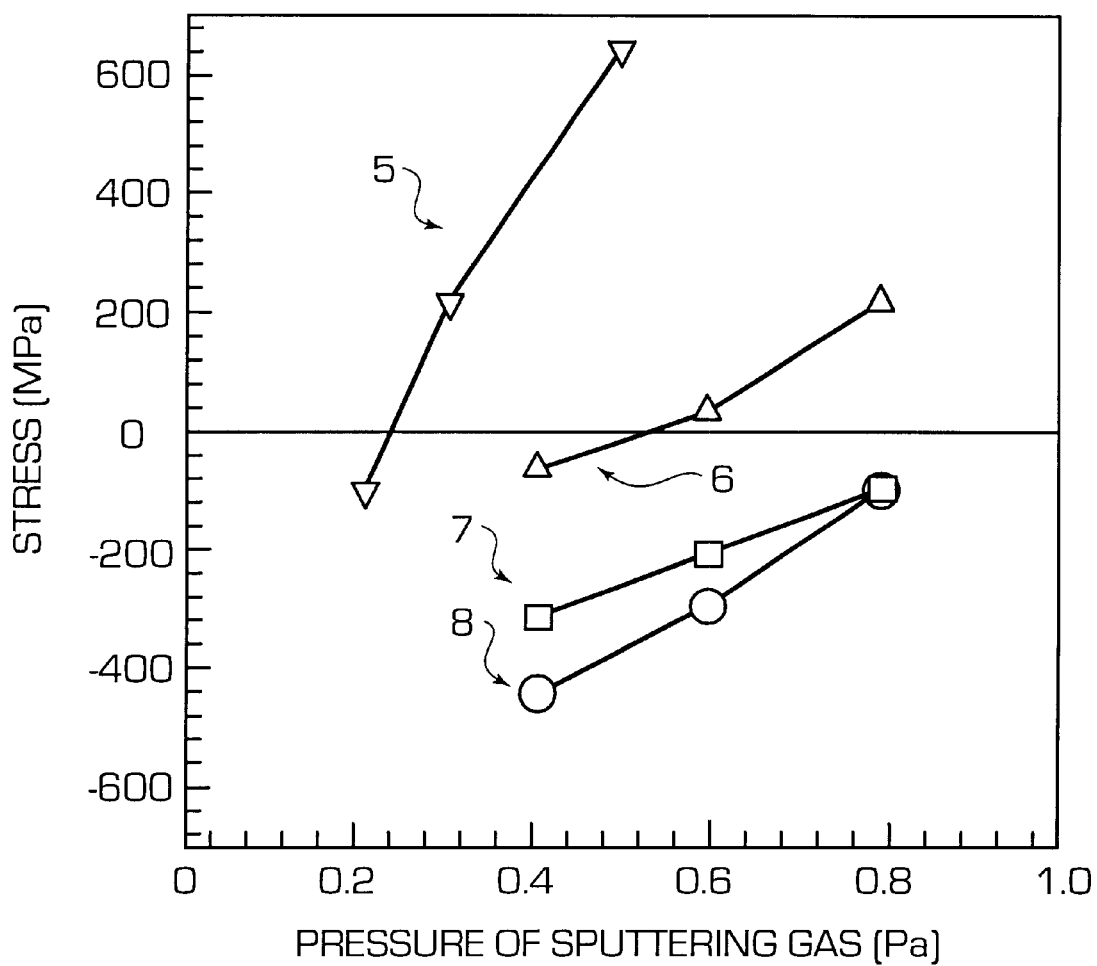
FIG. 4 is a graph showing a relation between a stress in TaRuGe film and a pressure of sputtering gas with a composition ratio of TaRuGe film being used as a parameter.

FIG. 4 is a graph showing a relation between a stress in the thin TaRuGe film 11 and a pressure of sputtering gas with a composition ratio the TaRuGe film 11 being used as a parameter. In FIG. 4, each of the lines indicated with the FIGS. 6, 7 and 8 shows a stress of a thin film composed of TaRuGe alloy having a composition ratio among Ta, Ru and Ge as follows.

Line 6: Ta:Ru:Ge=1.0:0.25:0.12
Line 7: Ta:Ru:Ge=1.0:0.14:0.12
Line 8: Ta:Ru:Ge=1.0:0.06:0.12

The thin film 11 composed of TaRuGe alloy has a thickness of 0.5 $\mu$m, and a temperature of the membrane 12 is equal to room temperature (RT) when the thin film 11 has been deposited. For comparison, FIG. 4 further includes the line 5 which indicates a stress of a thin metal film composed simply of tantalum (Ta).

As is understood in view of FIG. 4, a stress in the thin film 11 composed of TaRuGe alloy can be readily controlled by varying a composition ratio among Ta, Ru and Ge. For instance, a stress in the thin film 11 can be controlled by increasing or decreasing a composition ratio of Ru.

FIG. 4 shows that a stress in the thin TaRuGe film 11 varies from a compressive stress towards a tensile stress as a pressure of sputtering gas increases. As will be obvious in view of FIG. 4, a variation of a stress relative to a variation of a pressure of sputtering gas in the thin TaRuGe film 11 is smaller than the same in a thin film composed simply of tantalum. In other words, the lines 6, 7 and 8 have a greater inclination angle than that of the line 5. Hence, fluctuation in a pressure of sputtering gas exerts slight influence on reproducibility of a stress in the thin TaRuGe film 11. In addition, it would be possible to reduce non-uniformity in a stress in the thin TaRuGe film 11 which non-uniformity is caused by fluctuation in a pressure of sputtering gas.

In addition, a stress in the thin TaRuGe film 11 is hardly influenced by a temperature at which a thin film is deposited, impurities existing in a film deposition apparatus, and a temperature of a wall in a film deposition apparatus all of which exert serious influence on a stress in a conventional X-ray absorbing material. Accordingly, it would be possible to have a uniform stress profile in a resultant thin TaRuGe film even by means of a cheap film deposition apparatus which is not equipped with a super-high vacuum sputter chamber, a controller for controlling a temperature of a wall of a chamber, and a controller for controlling a temperature of a membrane.

Thus, it is possible to reproduce the thin TaRuGe film 11 having a low stress by controlling a composition ratio of the TaRuGe film 11 and a pressure of sputtering gas. A composition ratio of the thin TaRuGe film 11 can be varied in such a range that the above-mentioned amorphous structure can be obtained. In a preferable composition ratio, the thin film 11 contains Ru at 5 to 50% and Ge at 10 to 30%.

Ruthenium (Ru) and germanium (Ge) have a greater mass absorption coefficient of X-ray having a wavelength of about 10 angstroms, which X-ray is usually used in a 1:1 projection X-ray exposure system, than a mass absorption coefficient of B and Ti which were used as an additive to Ta, and Ta. An alloy composed of Ru, Ge and Ta can have a density almost the same as a density of tantalum (Ta), which density is equal to about 16 g/cm$^3$. Thus, it is understood that an alloy composed of Ta, Ru and Ge can have greater ability to disallow X-ray to pass therethrough than a metal or an alloy conventionally used as an X-ray absorbing material.

Furthermore, the thin film 11 composed of TaRuGe alloy forms quite thin passive state film at a surface thereof when exposed to atmosphere, and hence, is chemically stable, and is unlikely to vary a dimension of its pattern, although pattern is often varied in dimension due to oxidization after the X-ray absorber 11 has been patterned.

Hence, variation in a stress in the thin TaRuGe film 11, caused by oxidation of the thin TaRuGe film 11, is quite small. Specifically, it is equal to or smaller than 10 MPa, even in oxygen-ashing process carried out for removal of a resist film after patterning the thin TaRuGe film 11. In addition, if the thin TaRuGe film 11 is subject to acidic or alkaline wash, the thin TaRuGe film 11 is etched merely by 1 nm/min or smaller with a stress being kept unchanged.

The passive state film formed on a surface of the thin TaRuGe film 11 has a smaller thickness than a thickness of a passive state film formed on a surface of Ta or TaGe film, and hence, is more advantageous with respect to variation in a dimension and a stress after patterning, and accuracy at which a pattern edge is exposed to X-ray.

As explained so far, the use of the thin film 11 composed of TaRuGe alloy can solve all the problems of the conventional X-ray absorbing material, and there is presented a practically useful X-ray mask. By exposing a resist film to X-ray through the X-ray mask in accordance with the present invention, it would be possible to significantly enhance controllability and reproducibility in formation of a minute pattern in a semiconductor device.

The method of fabricating the thin TaRuGe film and the characteristics of the thin TaRuGe film are applied to a thin film composed of TaRuSi, ReGe or WGe alloy. That is, a thin film composed of TaRuSi, ReGe or WGe alloy can be deposited by sputtering. A stress in a thin film composed of TaRuSi, ReGe or WGe alloy is dependent only on a pressure of sputtering gas, and is hardly influenced by film-deposition parameters, such as a temperature at which a thin film is to be deposited. In addition, a stress in the thin film composed of TaRuSi, ReGe or WGe alloy is less dependent on a pressure of sputtering gas than a conventional thin film composed of Ta, resulting in high reproducibility in a stress in the thin film.

It is also possible to control a stress in the thin film composed of TaRuSi, ReGe or WGe alloy by varying a composition ratio among elements of which the thin film is composed.

Thus, a thin film having a low stress can be obtained with high reproducibility through the use of TaRuSi, ReGe or WGe alloy, as well as TaRuGe alloy.

In addition, it is possible for the thin film composed of TaRuSi, ReGe, WGe or TaRuGe alloy to have an amorphous structure In an amount of containing Si or Ge by 1% or greater. In a preferred composition ratio of such thin films, the thin TaRuSi film contains Ru at 3 to 60% and Si at 1 to 30%, and the thin ReGe or WGe film contains Ge at 1 to 30%. Similar to the thin TaRuGe film, the thin film composed of TaRuSi, ReGe or WGe alloy is chemically stable, because the thin film forms a passive state film at a surface thereof in atmosphere.

Rhenium (Re), germanium (Ge) and tungsten (W) composing the thin film have a greater X-ray absorption coefficient than that of tantalum (Ta), and both ReGe alloy and WGe alloy have a greater density than a density of tantalum (Ta). Hence, a thin film composed of ReGe or WGe alloy has greater ability to disallow X-ray to pass therethrough than a thin film composed of tantalum having been conventionally used.

On the other hand, with respect to the thin film composed of TaRuSi alloy, silicon (Si) has a small X-ray absorption coefficient, and the thin TaRuSi film would have a smaller density if a composition ratio of silicon is increased. Accordingly, it is disadvantageous for a thin film to contain silicon from the standpoint of ability of disallowing X-ray to pass therethrough.

However, it is possible to suppress reduction in ability to disallow X-ray to pass therethrough to a inconsequential degree, by decreasing a composition ratio of silicon in the thin TaRuSi film as much as possible so that the thin film can keep an amorphous structure and also have a low stress.

The above-mentioned thin film in the present invention may contain elements other than Ta, Ru, Ge, Si, W and Re. Even if a thin film contains such elements, the thin film would have the same characteristics as those of a thin film containing Ta, Ru, Ge, Si, W and Re only, and hence can be used for fabrication of an X-ray mask. For instance, even if a thin film contains Ti, Hf, W or Si at 5% or smaller, the thin film may be used for fabrication of an X-ray mask.

FIRST EXAMPLE

A method of fabricating an X-ray mask in accordance with the first example is explained hereinbelow with reference to FIGS. 5A to 5D.

First, thin films 22a are deposited on opposite surfaces of a silicon substrate 23 by chemical vapor deposition. The silicon substrate 23 has a thickness of 1 to 2 nm. The thin films 22a are composed of silicon carbide (SiC) and have a thickness of about 1 to 2 $\mu$m. One of the thin films 22a will make a membrane 22.

Figure 5A:
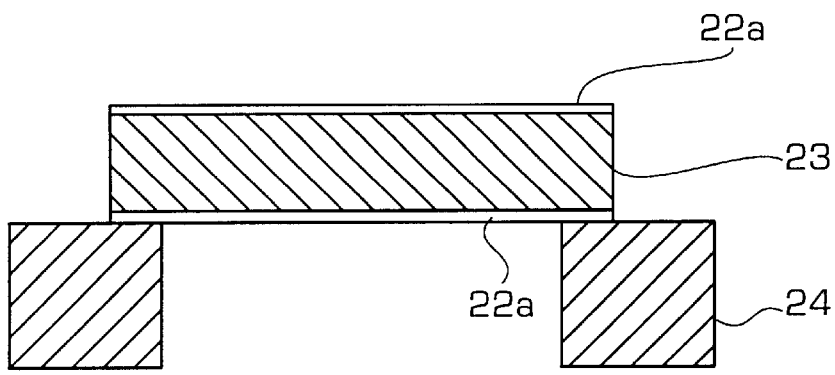
FIGS. 5A to 5D are cross-sectional views of the X-ray mask illustrated in FIG. 3, illustrating respective steps of a method of fabricating the same, in accordance with the first and third examples.

Then, as illustrated in FIG. 5A, a support ring 24 is adhered to a lower surface of the silicon substrate 23 at its periphery by means of an adhesive such as an epoxy resin. The support ring 24 is composed of glass or silicon carbide (SiC), and has a thickness of about 5 nm.

Figure 5B:
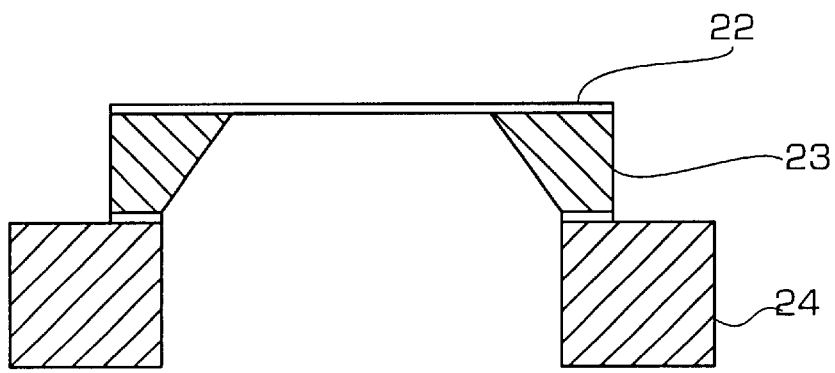

Then, as illustrated in FIG. 5B, the silicon substrate 23 is back etched from a lower surface thereof by anisotropic etching through the use of KOH aqueous solution. As a result of the etching, a portion of the silicon substrate 23 is removed, and there is formed a membrane 22 on the silicon substrate 23.

Figure 5C:
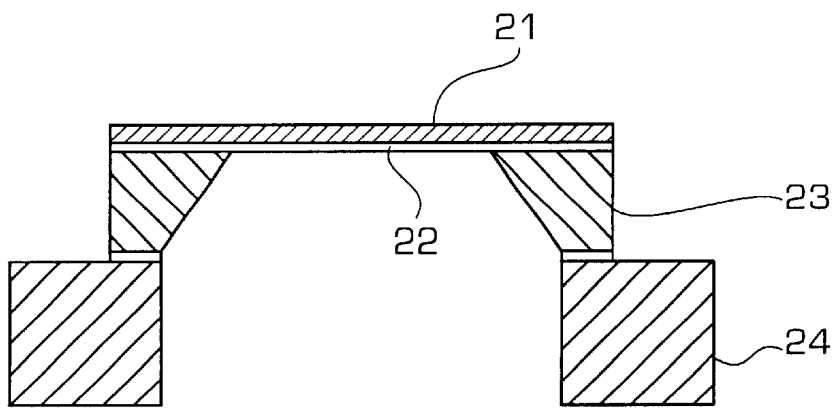

Then, as illustrated in FIG. 5C, a thin film 21 as an X-ray absorber is deposited on the membrane 22 by sputtering. In the first example, the thin film 21 is composed of TaRuGe alloy.

Figure 5D:
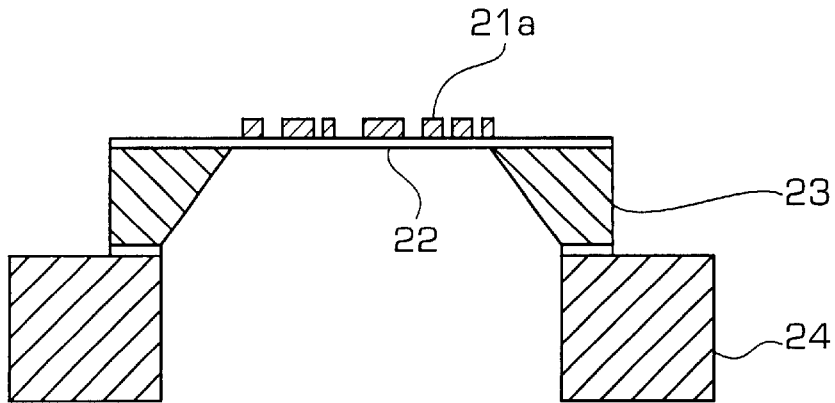

Then, as illustrated in FIG. 5D, the thin film 21 is patterned into a desired pattern 21a by dry etching in which there is used an etching gas such as $SF_6$ and $Cl_2$. Thus, there is completed an X-ray mask having a desired pattern 21a.

A composition ratio of the thin film 21 composed of TaRuGe alloy in the first example is as follows.

Ta:Ru:Ge=73.0%:18.2%:8.8%=1.0:0.25:0.12 A pressure of sputtering gas at the time when the thin film 21 is deposited by sputtering is set at 0.5 Pa.

As is obvious in view of FIG. 4, a thin TaRuGe film deposited under such a condition as mentioned above would have almost zero stress. In addition, a stress in a resultant thin TaRuGe film is slightly dependent on film-deposition parameters such as a pressure of sputtering gas. Hence, in accordance with the first example, it is possible to fabricate an X-ray mask with high reproducibility and the X-ray mask includes a thin film having a low stress uniformly distributed in the thin film.

SECOND EXAMPLE

In the second example, a silicon substrate is back etched after deposition of an X-ray absorber on a membrane unlike the process in accordance with the first example.

A method of fabricating an X-ray mask in accordance with the second example is explained hereinbelow with reference to FIGS. 6A to 6D.

Figure 6A:
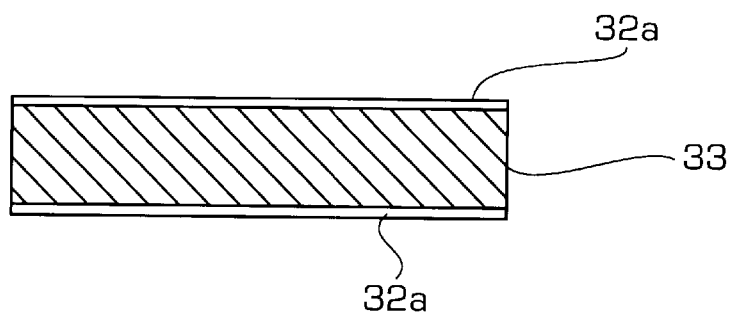
FIGS. 6A to 6D are cross-sectional views of the X-ray mask illustrated in FIG. 3, illustrating respective steps of a method of fabricating the same, in accordance with the second and fourth examples.
Figure 7:
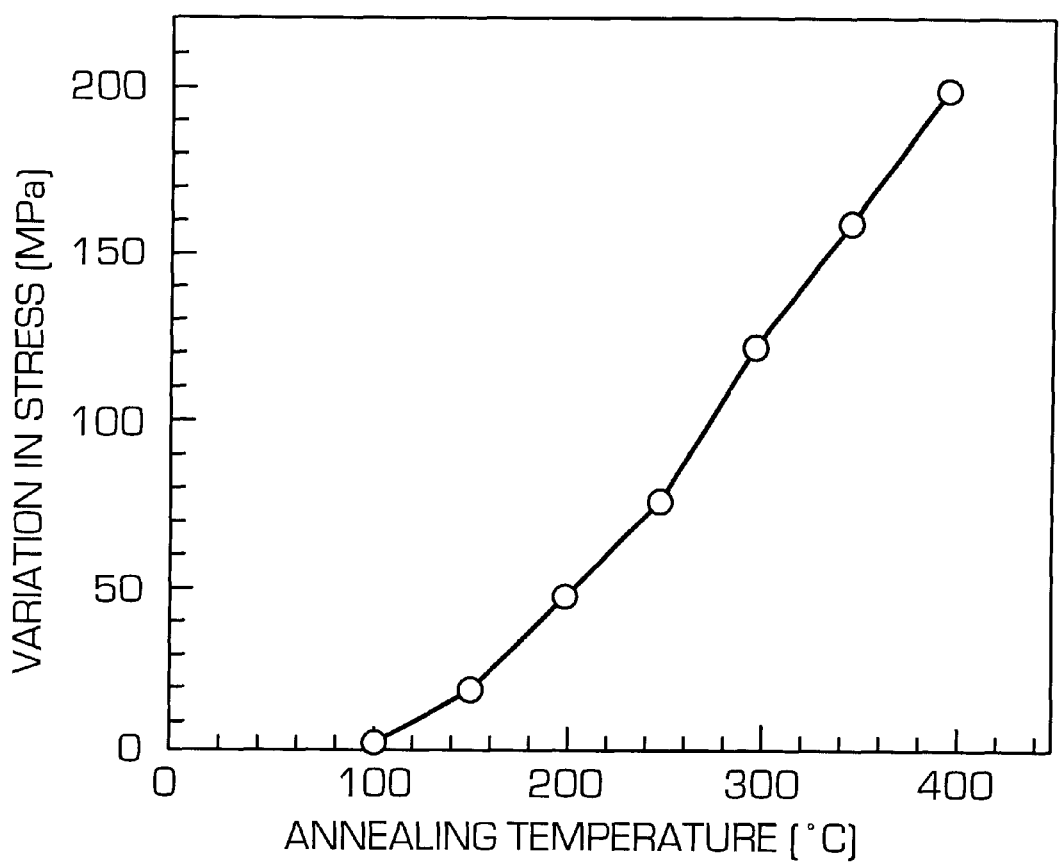
FIG. 7 is a graph showing, when TaRuGe film is annealed in vacuum, how a stress of the film varies.

First, as illustrated in FIG. 6A, thin films 32a are deposited on opposite surfaces of a silicon substrate 33 by chemical vapor deposition. The silicon substrate 33 has a thickness of 1 to 2 nm. The thin films 32a are composed of silicon carbide (SiC) and have a thickness of about 1 to 2 $\mu$m. One of the thin films 32a will make a membrane 32.

Figure 6B:
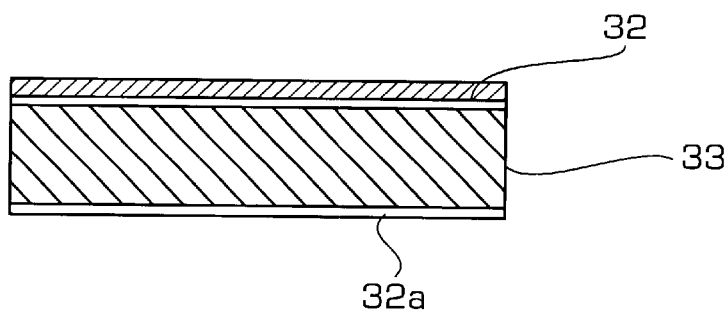

Then, as illustrated in FIG. 6B, a thin film 31 as an X-ray absorber is deposited on one of the thin films 32a by sputtering. In the second example, the thin film 31 is composed of TaRuGe alloy.

Figure 6C:
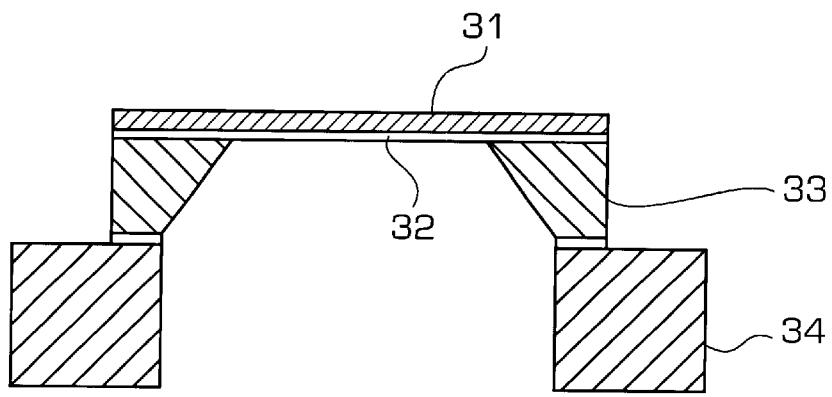

Then, as illustrated in FIG. 6C, the silicon substrate 33 is back etched from a lower surface thereof by anisotropic etching through the use of KOH aqueous solution. As a result of the etching, a portion of the silicon substrate 33 is removed, and there is formed a membrane 32 on the silicon substrate 33.

Then, as illustrated in FIG. 6C, a support ring 34 is adhered to a lower surface of the silicon substrate 33 at its periphery by means of an adhesive such as epoxy resin. The support ring 34 is composed of glass, and has a thickness of about 5 nm.

Figure 6D:
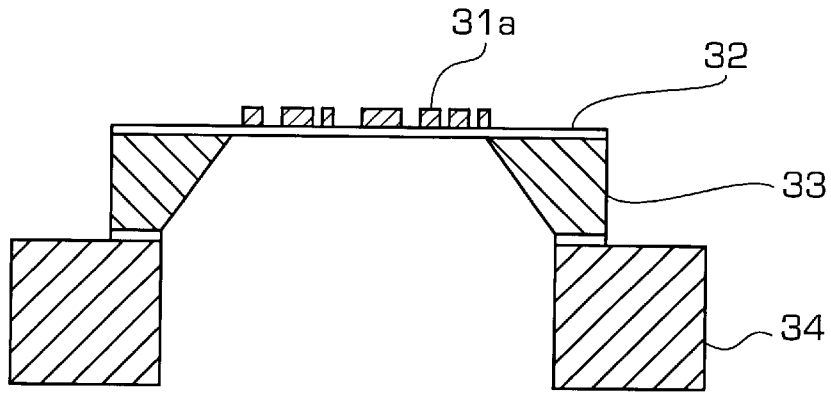

Then, a photoresist film is deposited on the thin TaRuGe film 31, and is patterned into a desired pattern. Then, the thin TaRuGe film 31 is patterned by dry etching through the use of an etching gas such as $SF_6$ and $Cl_2$ with the patterned photoresist film being used as a mask, as illustrated in FIG. 6D.

Thus, there is completed an X-ray mask having a desired pattern 31a. A composition ratio of the thin TaRuGe film 31 and film-deposition conditions are the same as those of the above-mentioned first example.

In the method in accordance with the second example, the thin film 31 composed of TaRuGe alloy, as an X-ray absorber, is deposited on the silicon substrate 3, as illustrated in FIG. 6B, in the first example. Hence, the second example has an advantage that it is possible to accurately measure a stress in the thin film 31 in each of the fabrication steps.

However, when the silicon substrate 33 is back etched to thereby form the membrane 32 after the deposition of the thin TaRuGe film 31, the support ring 4 may be deformed due to a tensile stress in the membrane 32, resulting in variation in stresses in the membrane 32 and the thin TaRuGe film 31. To avoid such variation in the stresses in the membrane 32 and the thin TaRuGe film 31, the thin TaRuGe film 31 may be deposited so as to have a stress which is closer to a tensile stress than a target stress, or deformation in a pattern of the patterned TaRuGe film 31a may be measured based on a stress in the patterned TaRuGe film 31a to thereby compensate for the pattern on the basis of the measured deformation.

[Second Embodiment]

In the X-ray mask in accordance with the present invention, it is possible to control a stress in the X-ray mask by annealing the thin alloy film of which the X-ray mask is composed. In the second embodiment, after a thin film composed of an X-ray absorber has been deposited, the thin film is annealed for controlling a stress therein.

An X-ray mask in accordance with the second embodiment can be fabricated by the same method of fabricating an X-ray mask in accordance with the first embodiment. For instance, the thin TaRuGe film 21 is annealed after deposition on the membrane 22.

FIG. 7 is a graph showing a relation between an annealing temperature and a stress in a thin TaRuGe film, which varies due to annealing carried out in vacuum after deposition of the thin TaRuGe film.

The thin TaRuGe film with a stress shown in FIG. 7, was deposited in the following conditions.

Film deposition temperature: room temperature
Pressure of sputtering gas: 0.8 Pa
Composition ratio: Ta:Ru:Ge=1.0:0.14:0.12

The thin TaRuGe film deposited in those conditions was annealed in vacuum at a pressure of $1 \times 10^4$ Pa or smaller.

As is understood in view of FIG. 7, if the thin TaRuGe film is annealed at a temperature of about 100 degrees centigrade or greater, a stress in the thin TaRuGe film varies towards a tensile stress immediately after deposition of the film. A stress varies to a greater degree at a higher annealing temperature.

If the thin TaRuGe film is annealed at a constant-temperature, variation in a stress in the thin TaRuGe film is saturated by about three minutes after commencement of annealing.

If the thin TaRuGe film is annealed at a relatively high temperature, for instance, at 300 degrees centigrade, a stress in the thin TaRuGe film is not varied, even if the thin TaRuGe film is annealed again at a relatively low temperature, for instance, at 150 degrees centigrade.

The results for the thin TaRuGe film, as mentioned above, are common to a thin film composed of TaRuGe film having a different composition ratio from that of the thin TaRuGe film illustrated in FIG. 7, and also common to a thin film composed of TaRuSi, ReGe or WGe alloy.

Though the thin TaRuGe film is annealed in vacuum in the second embodiment, the thin TaRuGe film may be annealed in an atmosphere containing gas therein which is inert to TaRuGe alloy, such as argon and nitrogen.

The above-mentioned results show that if the X-ray mask comprised of a thin film composed of TaRuGe, TaRuSi, ReGe or WGe is exposed to heat after deposition of the thin film, a stress in the thin film may be varied, and that it is possible to prevent variation which is caused in steps subsequent to deposition of the thin film in a stress in the thin film, by annealing the thin film at a temperature higher than a temperature at which the thin film may be exposed.

Based on these results, the thin alloy film is deposited to have a slight compressive stress, and then, the thin alloy film is annealed to thereby change a film stress towards a tensile stress from a compressive stress, resulting in a stress in the thin alloy film equal to almost zero.

As illustrated in FIG. 4, a stress in a thin alloy film of which the X-ray mask in accordance with the present invention is composed is less dependent on a pressure of sputtering gas at a smaller pressure of sputtering gas. Hence, it is possible to form a thin TaRuGe film having a low stress, with high reproducibility by the following steps. First, a thin TaRuGe film having a compressive stress therein is deposited by sputtering in such a manner that a pressure of sputtering gas is relatively low, and hence, a stress in a resultant thin TaRuGe film is slightly dependent on a pressure of sputtering gas, that is, a line in FIG. 4 has a small inclination. Second, the thus deposited thin TaRuGe film is annealed to thereby shift the stress towards a tensile stress.

In a photoresist step, an etching step, and an exposure step in a process of fabricating an X-ray mask, a temperature of the X-ray mask is raised generally up to about 150 degrees centigrade or smaller. Accordingly, it is preferable that the thin TaRuGe film is annealed at a temperature equal to or greater than 150 degrees centigrade.

As mentioned so far, it is possible to control a stress in the thin TaRuGe film and enhance thermal stability of the thin TaRuGe film by annealing the thin TaRuGe film after deposition thereof. From this standpoint, it is preferable to carry out annealing just after deposition of the thin TaRuGe film. However, annealing may be carried out after the thin TaRuGe film has been patterned for the purpose of only controlling a stress in the resultant film.

THIRD EXAMPLE

A method of fabricating an X-ray mask in accordance with the third example is explained hereinbelow with reference to FIGS. 5A to 5D.

First, thin films 22a were deposited on opposite surfaces of a silicon substrate 23 by chemical vapor deposition.

Then, as illustrated in FIG. 5A, a support ring 24 was adhered to a lower surface of the silicon substrate 23 at its periphery by means of an adhesive such as epoxy resin.

Then, as illustrated in FIG. 5B, the silicon substrate 23 was back etched from a lower surface thereof by anisotropic etching through the use of KOH aqueous solution. As a result of the etching, a portion of the silicon substrate 23 was removed, and there was formed a membrane 22 on the silicon substrate 23.

Then, as illustrated in FIG. 5C, a thin film 21 as an X-ray absorber was deposited on the membrane 22 by sputtering. In the third example, the thin film 21 was composed of TaRuGe alloy.

A composition ratio of the thin film 21 composed of TaRuGe alloy in the third example was as follows.

Ta:Ru:Ge=79.4% 11.1%:9.5%=1.0:0.14:0.12

A pressure of sputtering gas at the time when the thin film 21 was deposited by sputtering was set at 0.8 Pa. The other film-deposition conditions were the same as those of the first example.

The thus deposited thin TaRuGe film 21 had a compressive stress of about 120 MPa.

Then, the thus deposited TaRuGe film 21 was annealed at 300 degrees centigrade at atmospheric pressure for 10 minutes in nitrogen atmosphere. By carrying out annealing, the compressive stress in the thin TaRuGe film 21 is shifted towards a tensile stress by about 120 MPa. Accordingly, the compressive stress generated just after deposition of the thin TaRuGe film 21 and the variation in a stress caused by annealing cancel each other, resulting in the thin TaRuGe film 21 having stress equal to almost zero.

Then, as illustrated in FIG. 5D, the thin film 21 is patterned into a desired pattern 21a by dry etching. Thus, an X-ray mask having a desired pattern 21a is completed.

FOURTH EXAMPLE

A method of fabricating an X-ray mask in accordance with the fourth example is explained hereinbelow with reference to FIGS. 6A to 6D.

First, as illustrated in FIG. 6A, thin films 32a are deposited on opposite surfaces of a silicon substrate 33 by chemical vapor deposition. The silicon substrate 33 has a thickness of 1 to 2 nm. The thin films 32a are composed of silicon carbide (SiC) and have a thickness of about 1 to 2 μm. One of the thin films 32a will make a membrane 32.

Then, as illustrated in FIG. 6B, a thin film 31 as an X-ray absorber is deposited on one of the thin films 32a by sputtering. In the fourth example, the thin film 31 is composed of TaRuGe alloy.

Then, the thin film 31 is annealed.

Hereinafter, the same steps as those of the second example are carried out to thereby fabricate an X-ray mask.

Similar to the third example, the thin TaRuGe film 31 is formed to have a compressive stress. For instance, a thin film is formed in the following composition ratio through the use of sputtering gas having a pressure of 0.8 Pa.

Ta:Ru:Ge=79.4%:11.1%:9.5%=1.0:0.14:0.12

As a result, the resultant TaRuGe film 31 would have a compressive stress of about 120 MPa.

By annealing the thin TaRuGe film 31 at 300 degrees centigrade at atmospheric pressure for 10 minutes in nitrogen atmosphere, it is possible to shift the compressive stress towards a tensile stress, resulting in fabrication of an X-ray mask composed of an X-ray absorber having a quite low stress.

As explained above in the first and second embodiments, the present invention makes it possible to provide a thin film having a low stress with high controllability by controlling a composition ratio, film-deposition conditions such as a pressure of sputtering gas, and conditions for carrying out annealing. As a result, an X-ray mask having quite small positional distortion can be obtained.

Although a thin film of the X-ray mask fabricated in accordance with the first to fourth examples is composed of TaRuGe alloy, the thin film may be composed of TaRuSi alloy, ReGe alloy or WGe alloy in place of TaRuGe alloy.

The present invention is characterized by the use of a thin film composed of TaRuGe alloy, TaRuSi alloy, ReGe alloy or WGe alloy. Hence, other parts constituting an X-ray mask, such as the membrane 22 and 32, the silicon substrate 23 and 33, and the support ring 24 and 34 may be replaced with an equivalent.

[Third Embodiment]

It is possible to fabricate a semiconductor device having a minute pattern by carrying out X-ray lithography through the use of the X-ray mask fabricated in accordance with the first or second embodiment.

A semiconductor device, for instance, a semiconductor chip such as memory and logic, a charge coupled device (CCD), a thin film magnetic head, and a micro-machine, is fabricated into a final product through the steps of forming a circuit on a wafer, and chipping or packaging the wafer. A process for forming a wafer includes various steps such as steps of forming an insulating film, forming an electrode, and ion-implanting. Among those steps, a step of forming a pattern on a substrate accurately in line with a device design drawing is lithography. In a lithography step, steps of application of a resist film, exposure, and development are carried out. As a result, a resist pattern is formed on a substrate.

The X-ray mask in accordance with the present invention comprised of a thin film composed of TaRuGe alloy, TaRuSi alloy, ReGe alloy and or WGe alloy is suitable for all X-ray lithography where a resist film is exposed to X-ray. In particular, the X-ray mask is useful when a minute pattern having a size of 0.13 µm or smaller is to be formed, or a pattern having a relatively great aspect ratio, specifically, an aspect ratio greater than five, is to be formed.

In fabrication of a semiconductor device, a pattern formed on a first layer overlaps a pattern formed on a second layer. An error in such overlapping has to be equal to or smaller than one-second to one-ninth of a minimum width of a pattern.

Since the X-ray masks in accordance with the first to fourth examples are highly controlled with respect to a stress in an X-ray absorber, the X-ray masks have smaller positional distortion than a conventional X-ray mask.

For instance, if the membrane is composed of SiC, and the X-ray absorber is patterned into a thin film having a stress of ±5 MPa in 35×35 mm$^2$ square by 50% coverage rate, the thin film composed of the X-ray absorber would have a maximum positional distortion of 5 nm or smaller. This shows that it is possible to form a pattern in accordance with a device design drawing by using the X-ray mask in the exposure process.

Thus, it would be possible to fabricate a semiconductor device with high fabrication yield by carrying out X-ray lithography through the use of the X-ray mask in accordance with the present invention.

Although the thin film composed of TaRuGe, TaRuSi, ReGe or WGe alloy is applied to an X-ray mask in the above-mentioned embodiments or examples, it should be noted that the use of the thin film is not to be limited to an X-ray mask. The thin film composed of TaRuGe, TaRuSi, ReGe or WGe alloy is useful to any application which requires a thin film having a low stress.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-140771 filed on May 22, 1998 including specification, claims, drawings and summary is incorporated herein by reference in its entirety.

What is claimed is:

1. An X-ray mask comprising:
   (a) an X-ray permeable membrane; and
   (b) an X-ray absorber formed in a pattern on said X-ray permeable membrane,
   said X-ray absorber being composed of an alloy comprising rhenium (Re) and germanium (Ge).

2. The X-ray mask as set forth in claim 1, wherein said alloy contains germanium (Ge) by 1 to 30 atomic %.

3. The X-ray mask as set forth in claim 1, wherein said alloy contains rhenium (Re) and germanium (Ge) totally by 95 atomic % or greater.

4. The X-ray mask as set forth in claim 1, wherein said alloy is amorphous.

5. An X-ray mask comprising:
   (a) an X-ray permeable membrane; and
   (b) an X-ray absorber formed in a pattern on said X-ray permeable membrane,
   said X-ray absorber being composed of an alloy comprising tungsten (W) and germanium (Ge).

6. The X-ray mask as set forth in claim 5, wherein said alloy contains germanium (Ge) by 1 to 30 atomic %.

7. The X-ray mask as set forth in claim 5, wherein said alloy contains tungsten (W) and germanium (Ge) totally by 95 atomic % or greater.

8. The X-ray mask as set forth in claim 5, wherein said alloy is amorphous.

9. A thin film composed of an alloy, said alloy comprising one of the following groups:
   (a) tantalum (Ta), ruthenium (Ru), and germanium (Ge);
   (b) tantalum (Ta), ruthenium (Ru), and silicon (Si);
   (c) rhenium (Re) and germanium (Ge); and
   (d) tungsten (W) and germanium (Ge).

10. A method of fabricating an X-ray mask, comprising the steps of:
 (a) forming a thin film on an X-ray permeable membrane, said thin film composed of an alloy comprising one of the following groups:
  (a1) tantalum (Ta), ruthenium (Ru), and germanium (Ge);
  (a2) tantalum (Ta), ruthenium (Ru), and silicon (Si);
  (a3) rhenium (Re) and germanium (Ge); and
  (a4) tungsten (W) and germanium (Ge), and
 (b) patterning said thin film in a desired pattern.

11. The method as set forth in claim 10, further comprising the step of annealing said thin film.

12. The method as set forth in claim 11, wherein said thin film is formed in said step (a) so as to have a compressive stress therein.

13. The method as set forth in claim 11, wherein said annealing is carried out at a temperature equal to or greater than 100 degrees centigrade.

14. The method as set forth in claim 11, wherein said annealing is carried out in vacuum atmosphere or in inert gas atmosphere.

15. The method as set forth in claim 11, wherein said step of annealing said thin film is carried out subsequently to said step (a), but prior to said step (b).

16. The method as set forth in claim 10, wherein said thin film is formed by sputtering in said step (a).

17. The method as set forth in claim 10, wherein said thin film is formed in said step (a) so as to have a stress closer to a tensile stress than a target stress.

18. The method as set forth in claim 10, further comprising the step of calculating deformation in said thin film's pattern after said thin film has been formed, based on a stress of said thin film, and compensating for said pattern on the basis of the calculation.

19. A method of forming a film required to have a low stress therein, comprising the steps of:
 (a) forming a thin film composed of an alloy comprising one of the following groups:
  (a1) tantalum (Ta), ruthenium (Ru), and germanium (Ge);
  (a2) tantalum (Ta), ruthenium (Ru), and silicon (Si);
  (a3) rhenium (Re) and germanium (Ge); and
  (a4) tungsten (W) and germanium (Ge), and
 (b) patterning said thin film in a desired pattern.

20. A method of fabricating a semiconductor device, comprising the steps of:
 (a) depositing a resist film on a substrate;
 (b) setting an X-ray mask above said resist film; and
 (c) radiating X-ray to said resist film through said X-ray mask to thereby pattern said resist film in a desired pattern,
 said X-ray mask comprising:
 (a) an X-ray permeable membrane; and
 (b) an X-ray absorber formed in a pattern on said X-ray permeable membrane,
 said X-ray absorber being composed of an alloy comprising one of the following groups:
  (a) tantalum (Ta), ruthenium (Ru), and germanium (Ge);
  (b) tantalum (Ta), ruthenium (Ru), and silicon (Si);
  (c) rhenium (Re) and germanium (Ge); and
  (d) tungsten (W) and germanium (Ge).

21. The method as set forth in claim 20, wherein said alloy contains ruthenium (Ru) by 3 to 60 atomic %, and germanium (Ge) by 1 to 30 atomic %, when said alloy is comprised of tantalum (Ta), ruthenium (Ru), and germanium (Ge).

22. The method as set forth in claim 20, wherein said alloy contains tantalum (Ta), ruthenium (Ru), and germanium (Ge) totally by 95 atomic % or greater, when said alloy is comprised of tantalum (Ta), ruthenium (Ru), and germanium (Ge).

23. The method as set forth in claim 20, wherein said alloy contains ruthenium (Ru) by 3 to 60 atomic %, and silicon (Si) by 1 to 30 atomic %, when said alloy is comprised of tantalum (Ta), ruthenium (Ru), and silicon (Si).

24. The method as set forth in claim 20, wherein said alloy contains tantalum (Ta), ruthenium (Ru), and silicon (Si) totally by 95 atomic % or greater, when said alloy is comprised of tantalum (Ta), ruthenium (Ru), and silicon (Si).

25. The method as set forth in claim 20, wherein said alloy contains germanium (Ge) by 1 to 30 atomic %, when said alloy is comprised of rhenium (Re) and germanium (Ge).

26. The method as set forth in claim 20, wherein said alloy contains rhenium (Re) and germanium (Ge) totally by 95 atomic % or greater, when said alloy is comprised of rhenium (Re) and germanium (Ge).

27. The method as set forth in claim 20, wherein said alloy contains germanium (Ge) by 1 to 30 atomic %, when said alloy is comprised of rhenium (Re) and tungsten (W).

28. The method as set forth in claim 20, wherein said alloy contains tungsten (W) and germanium (Ge) totally by 95 atomic % or greater, when said alloy is comprised of rhenium (Re) and tungsten (W).

29. The method as set forth in claim 20, wherein said alloy is amorphous.

* * * * *